United States Patent [19]
Lee

[11] Patent Number: 5,678,627
[45] Date of Patent: Oct. 21, 1997

[54] CPU HEAT SINK MOUNTING STRUCTURE

[76] Inventor: Richard Lee, 10F, No. 525, Chung-Cheng Rd., Hsintien, Taipei Hsien, Taiwan

[21] Appl. No.: 582,484

[22] Filed: Jan. 3, 1996

[51] Int. Cl.[6] ............................... F28F 7/00; H05K 7/20
[52] U.S. Cl. ..................... 165/80.3; 165/121; 165/185; 174/16.3; 257/719; 361/697; 361/704
[58] Field of Search ..................... 165/80.3, 185, 165/121; 174/16.3; 257/718, 719; 361/695, 704, 697, 707

[56] References Cited

U.S. PATENT DOCUMENTS

| | | | |
|---|---|---|---|
| 5,251,101 | 10/1993 | Liu | 257/718 X |
| 5,448,449 | 9/1995 | Bright et al. | 361/704 |
| 5,475,564 | 12/1995 | Chiou | 361/704 |
| 5,509,465 | 4/1996 | Lai | 165/80.3 |
| 5,519,574 | 5/1996 | Kodama et al. | 361/697 |
| 5,542,468 | 8/1996 | Lin | 165/80.3 |
| 5,544,013 | 8/1996 | Chiou | 361/697 X |

*Primary Examiner*—Leonard R. Leo
*Attorney, Agent, or Firm*—Browdy and Neimark

[57] ABSTRACT

A CPU heat sink mounting structure which includes a front clamping wire, a rear clamping wire, and a heat sink mounted on a CPU above a CPU mount and secured in place by the clamping wires, wherein the front clamping wire has two hooked tips respectively hooked in a pair of first retaining holes on the heat sink, an arched middle section, two S-shaped clamping arm sections connected between the hooked tips and the arched middle section and clamped on the periphery of the heat sink and the CPU, and two retaining sections bilaterally connected between the S-shaped clamping arm sections and the arched middle section and respectively forced into engagement with respective retainer blocks of the CPU mount; the rear clamping wire has two hooked tips respectively hooked in a pair of second retaining holes on the heat sink, a downward middle section hung on a rib at the rear side of the CPU mount, and two L-shaped clamping arm sections connected between the hooked tips and the downward middle section and clamped on the periphery of the heat sink and the CPU.

2 Claims, 14 Drawing Sheets

FIG.14

CPU HEAT SINK MOUNTING STRUCTURE

BACKGROUND OF THE INVENTION

The present invention relates to a CPU heat sink mounting structure which uses two steel clamping wires to detachably secure a heat sink to a CPU mount to hold down a CPU.

During the operation of the CPU of a computer system, heat must be quickly carried away from the CPU so that the CPU can work normally. Various heat sinks and fans have been developed for this purpose. When a heat sink is used, it must be closely secured to the CPU so that heat can be efficiently carried away from the CPU. Conventionally, heat sink mounting frames or fixtures are used for securing heat sinks in place. However, these heat sink mounting frames and fixtures are complicated to install, and cannot be conveniently dismantled after installation.

SUMMARY OF THE INVENTION

It is one object of the present invention to provide a CPU heat sink mounting structure which can be conveniently installed. It is another object of the present invention to provide a CPU heat sink mounting structure which can be conveniently dismantled. It is still another object of the present invention to provide a CPU heat sink mounting structure which is easy and inexpensive to manufacture. According to one embodiment of the present invention, the CPU heat sink mounting structure comprises a front clamping wire, a rear clamping wire, and a heat sink mounted on a CPU above a CPU mount and secured in place by the clamping wires, wherein the front clamping wire has two hooked tips respectively hooked in a pair of first retaining holes on the heat sink, an arched middle section, two S-shaped clamping arm sections connected between the hooked tips and the arched middle section and clamped on the periphery of the heat sink and the CPU, and two retaining sections bilaterally connected between the S-shaped clamping arm sections and the arched middle section and respectively forced into engagement with respective retainer blocks of the CPU mount; the rear clamping wire has two hooked tips respectively hooked in a pair of second retaining holes on the heat sink, a downward middle section hung on a rib at the rear side of the CPU mount, and two L-shaped clamping arm sections connected between the hooked tips and the downward middle section and clamped on the periphery of the heat sink and the CPU. According to another embodiment of the present invention, the front clamping wire and the rear clamping wire have looped portions for fastening to a fan above the heat sink by screws.

DETAILED DESCRIPTION OF THE PREFERRED EMBODIMENT

Figure 1:
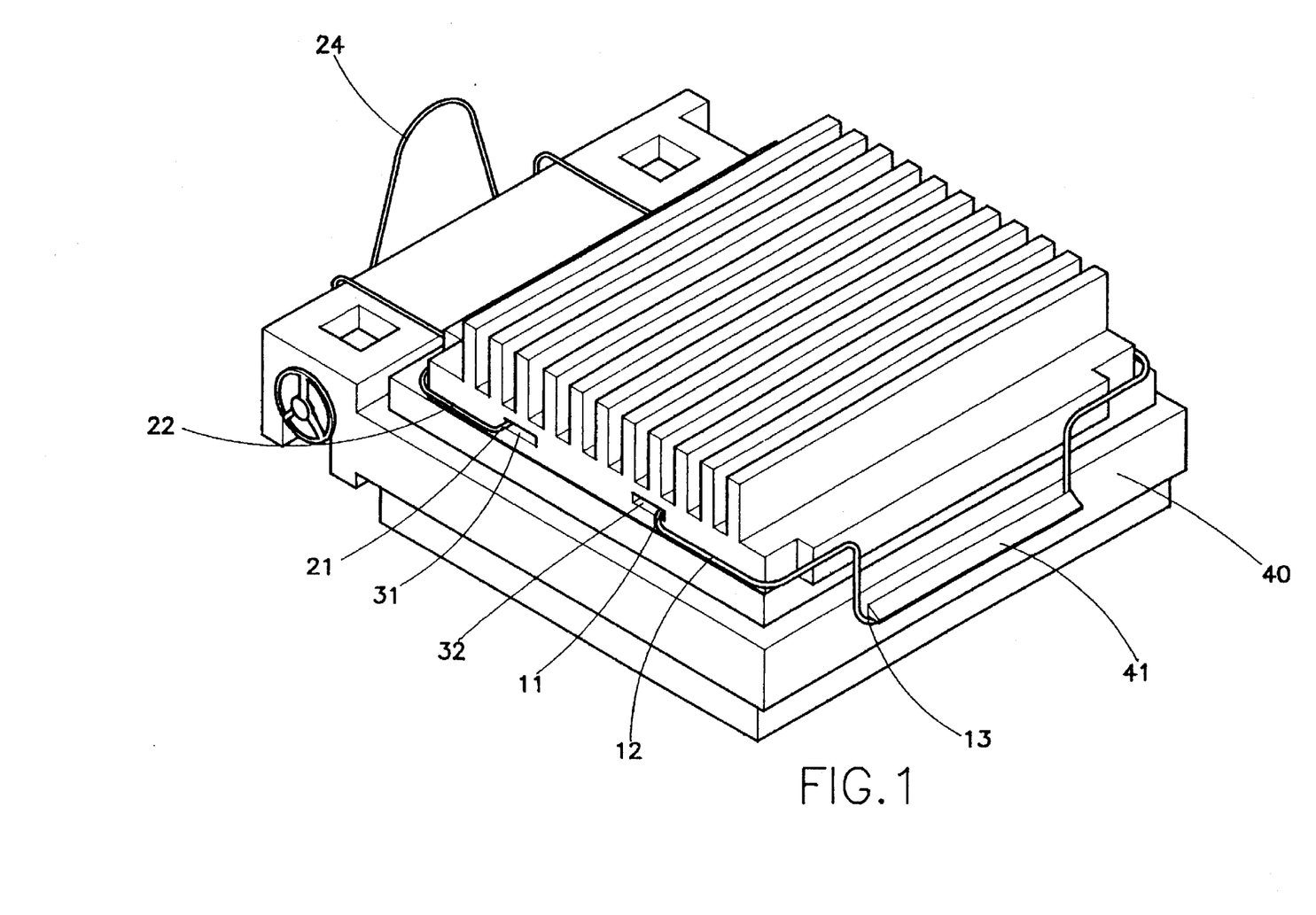
FIG. 1 an elevational view of a CPU heat sink mounting structure according to a first embodiment of the present invention.
Figure 2:
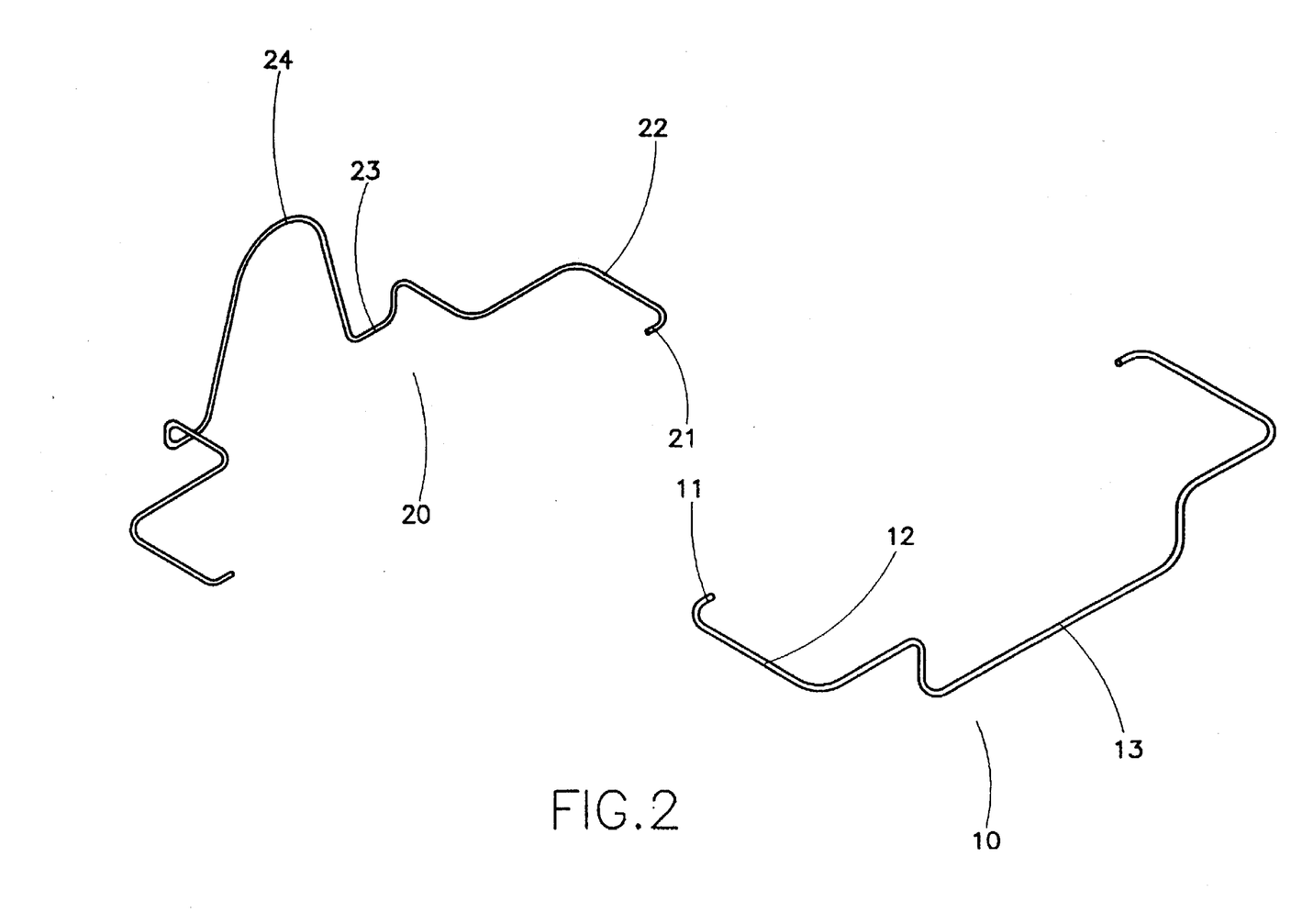
FIG. 2 shows a front clamping wire and a rear clamping wire according to the first embodiment of the present invention.

Referring to FIGS. 1 and 2, a heat sink 30 is mounted on a CPU 50 above a CPU mount 40, and secured in place by two steel clamping wires, namely, the rear clamping wire 10 and the front clamping wire 20. The rear clamping wire 10 comprises two hooked tips 11 at two opposite ends horizontally facing toward each other, a downward middle section 13, and two L-shaped clamping arm sections 12 horizontally disposed at two opposite sides and connected between the hooked tips 11 and the downward middle section 13. The front clamping wire 20 comprises two hooked tips 21 at two opposite ends horizontally facing toward each other, an arched middle section 24 vertically disposed in the middle, two S-shaped clamping arm sections 22 horizontally disposed at two opposite sides and connected between the hooked tips 11 and the arched middle section 24, and two retaining sections 23 bilaterally connected between the S-shaped clamping arm sections 22 and the arched middle section 24.

Figure 3:
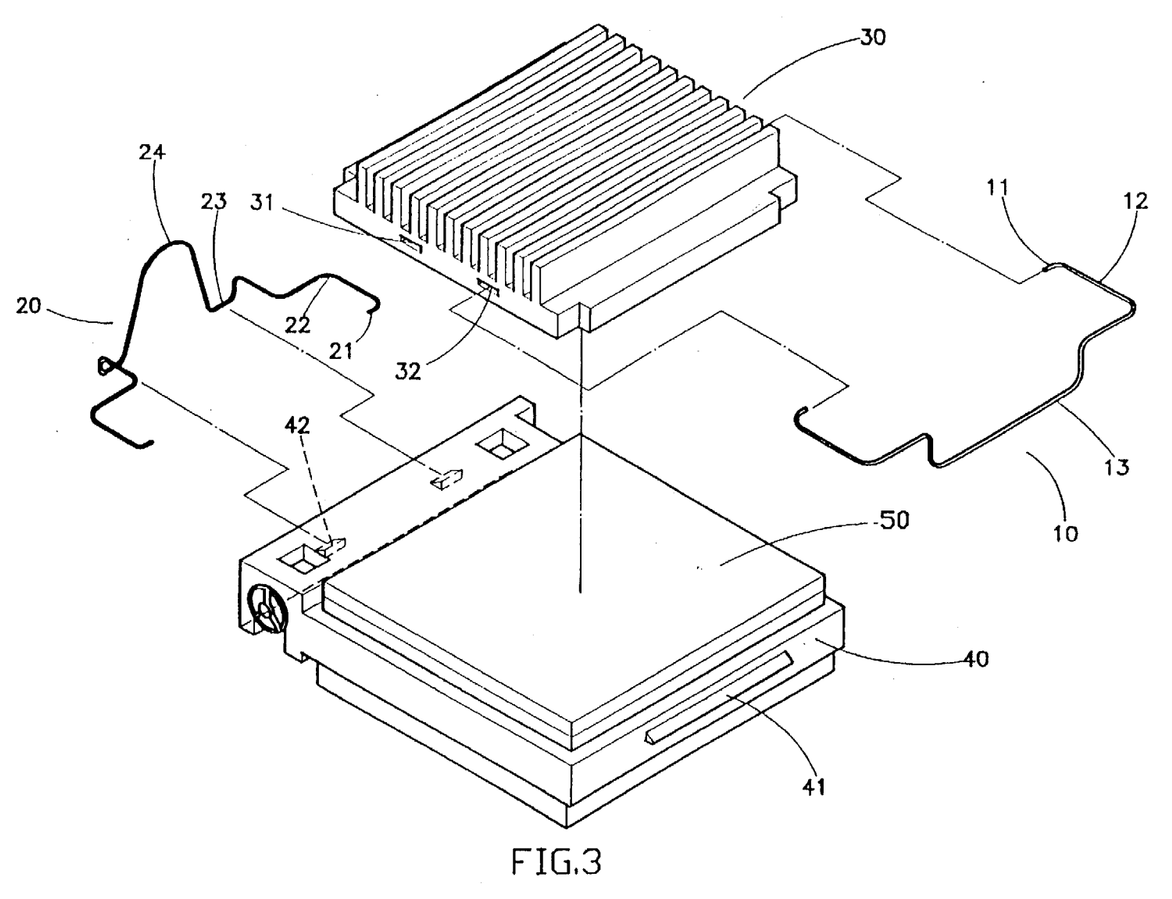
FIG. 3 is an exploded view of the first embodiment of the present invention.
Figure 4:
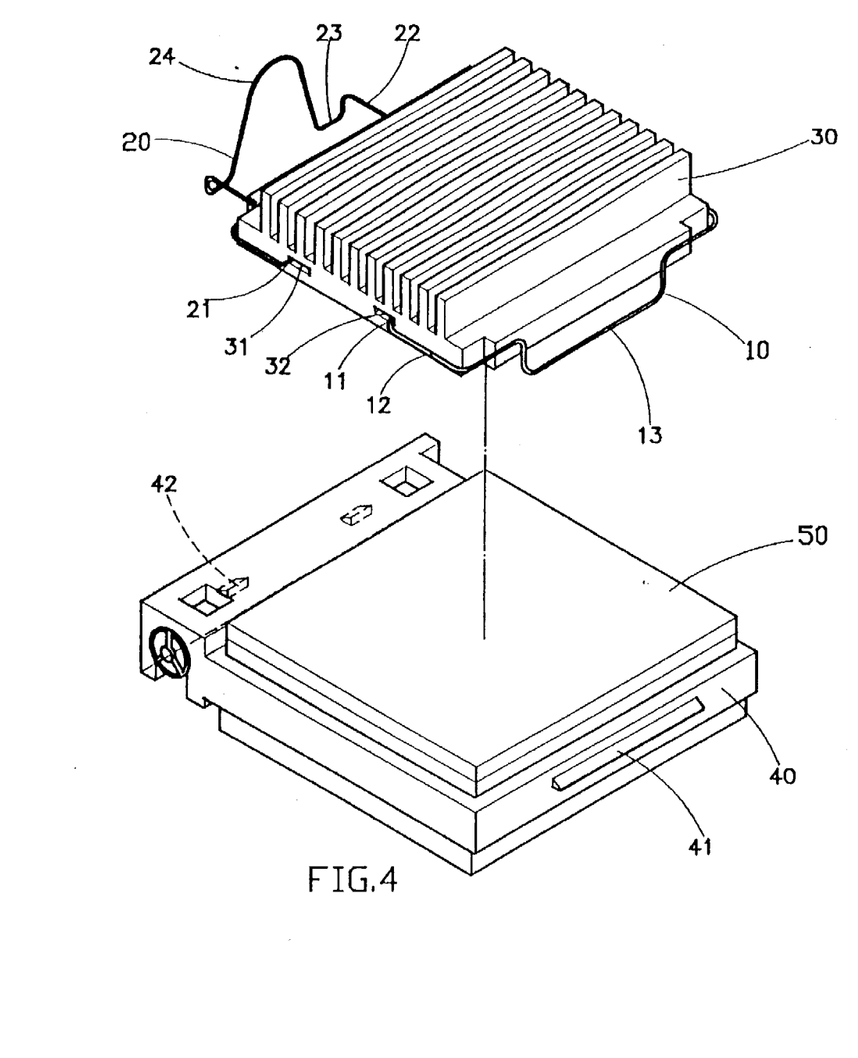
FIG. 4 is another exploded view of the first embodiment of the present invention, showing the clamping wires fastened to the heat sink.

Referring to FIGS. 3 and 4, during the installation of the CPU heat sink mounting structure, the hooked tips 11 and 21 of the clamping wires 10 and 20 are respectively hooked in respective retaining holes 32 and 31 at two opposite sides of the heat sink 30, the middle section 13 of the rear clamping wire 10 is hung on a rear rib 41 at the rear side of the CPU mount 40, the two retaining sections 23 are respectively fastened to two retainer blocks 42 at the front side of CPU mount 40, the L-shaped clamping arm sections 12 of the rear clamping wire 10 and the S-shaped clamping arm sections 22 of the front clamping wire 20 are respectively clamped on the periphery of said heat sink and said CPU 50.

Figure 5:
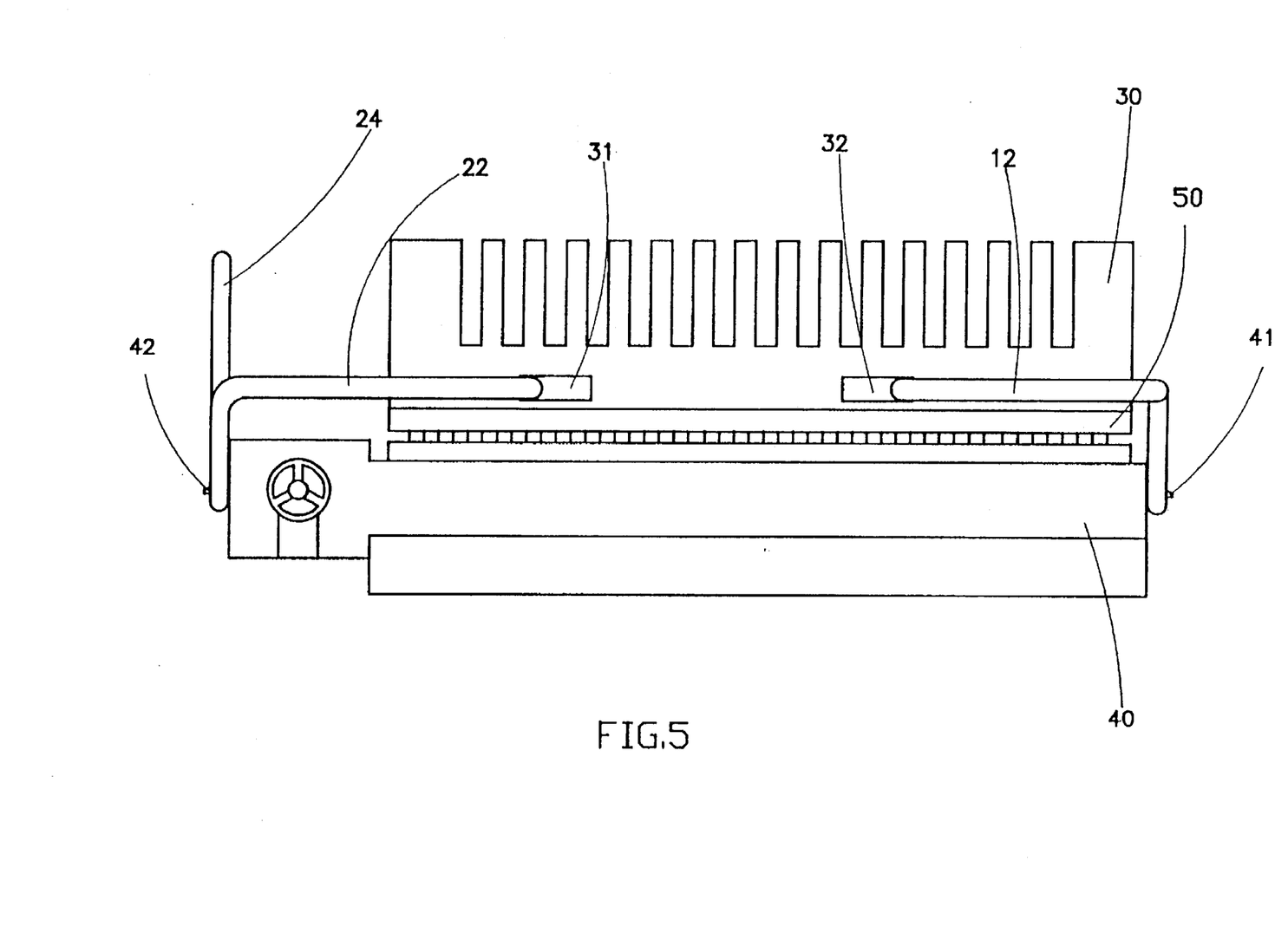
FIG. 5 is a side view of FIG. 1 in an enlarged scale.
Figure 6:
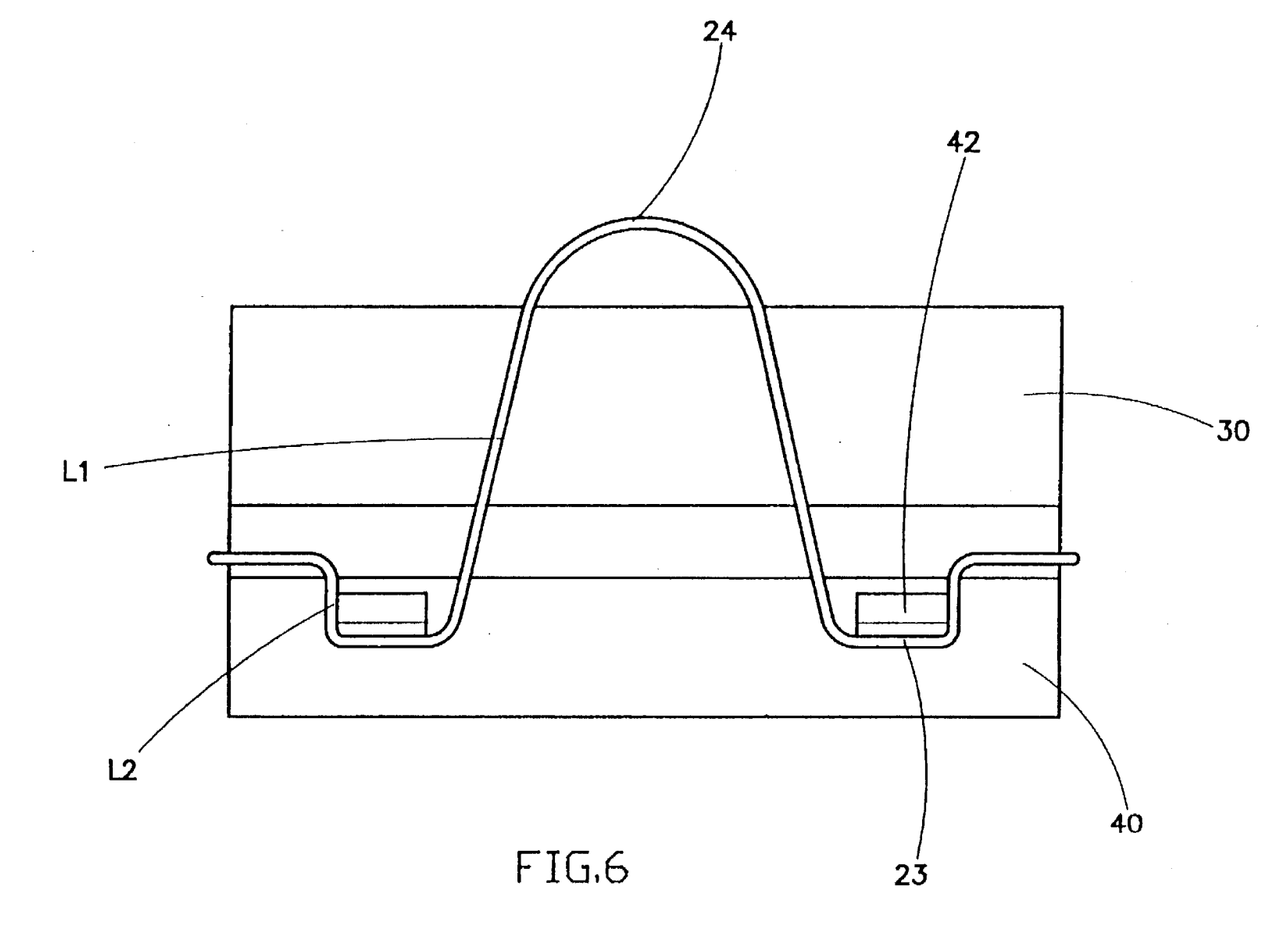
FIG. 6 is a front end view of FIG. 1 in an enlarged scale.
Figure 7:
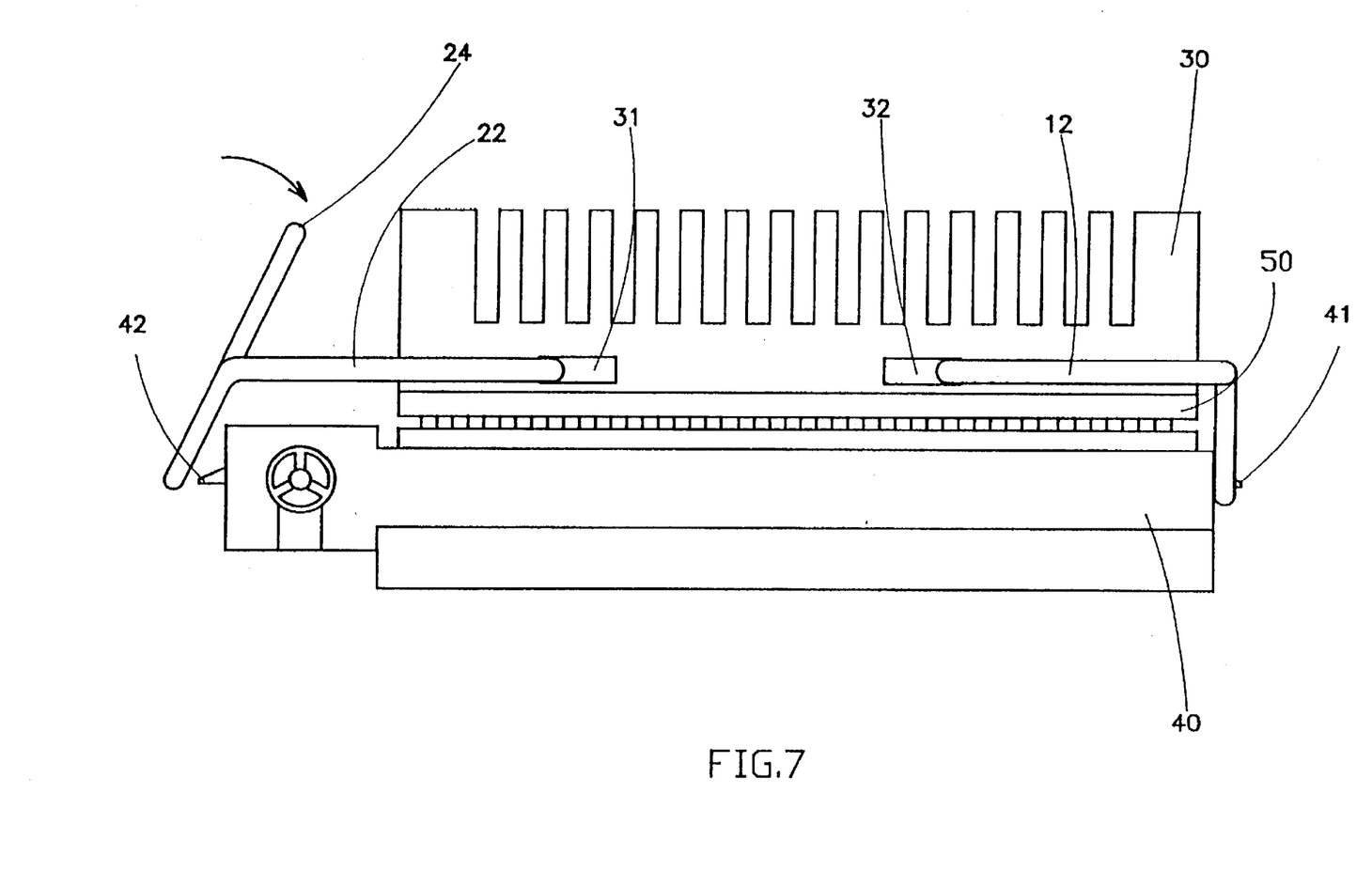
FIG. 7 is similar to FIG. 5 but showing the arched middle section of the front clamping wire turned forwardly downwards.

Referring to FIGS. 5, 6, and 7, the arm of force L1 of the arched middle section 24 is bigger than the arm of force L2 of each of the retaining sections 23. When the arched middle section 24 is forced forwardly downwards, the retaining sections 23 are forced away from the retainer blocks 42, and therefore the heat sink 30 can be quickly removed from the CPU 50.

Figure 8:
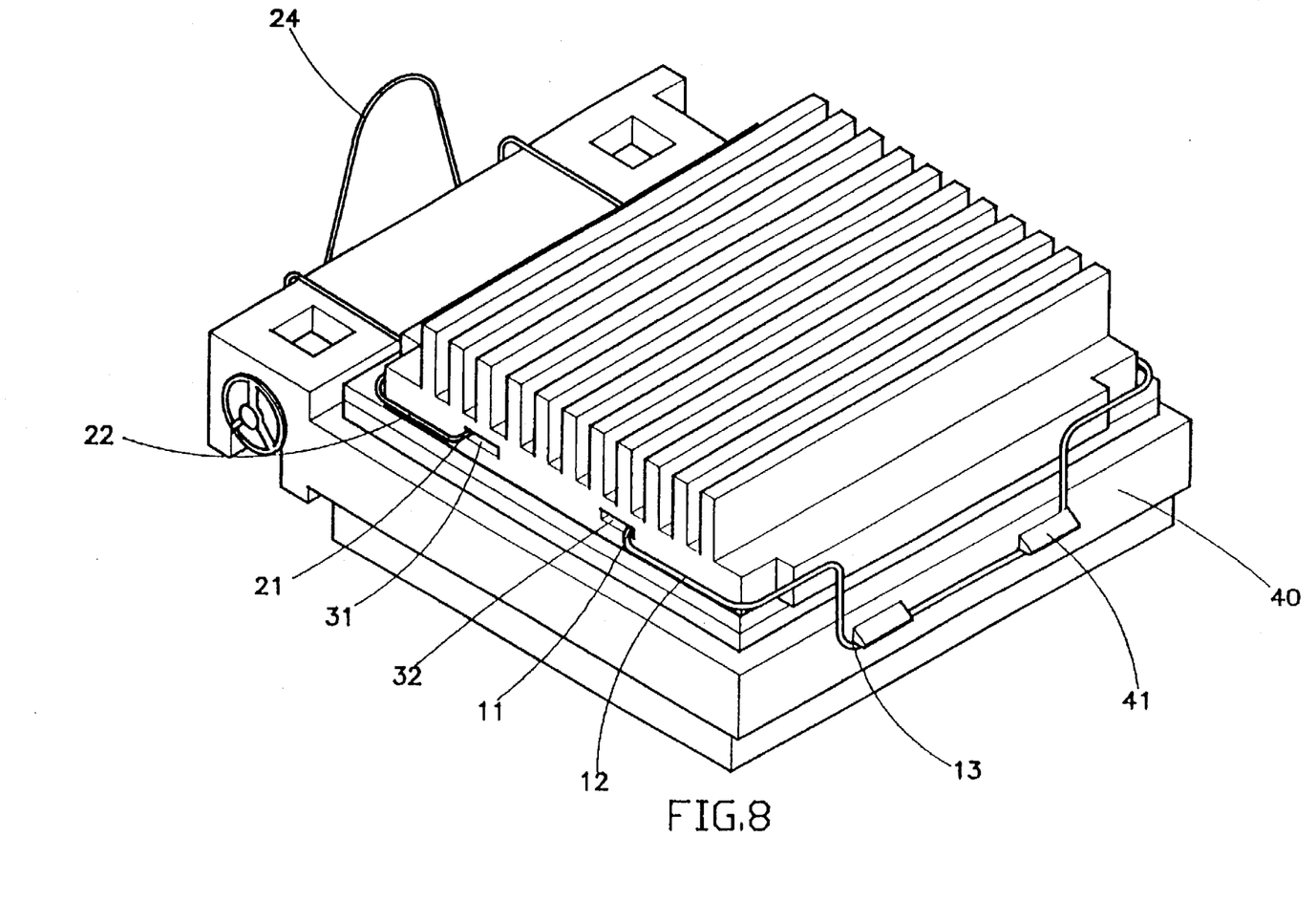
FIG. 8 is similar to FIG. 1 but showing an alternate form of the CPU mount according to the present invention.

Referring to FIG. 8, two spaced ribs 41 may be made on the rear side of the CPU mount 40 (instead of the aforesaid single rib 41) for mounting the middle section 13 of the rear clamping wire 10.

Figure 9:
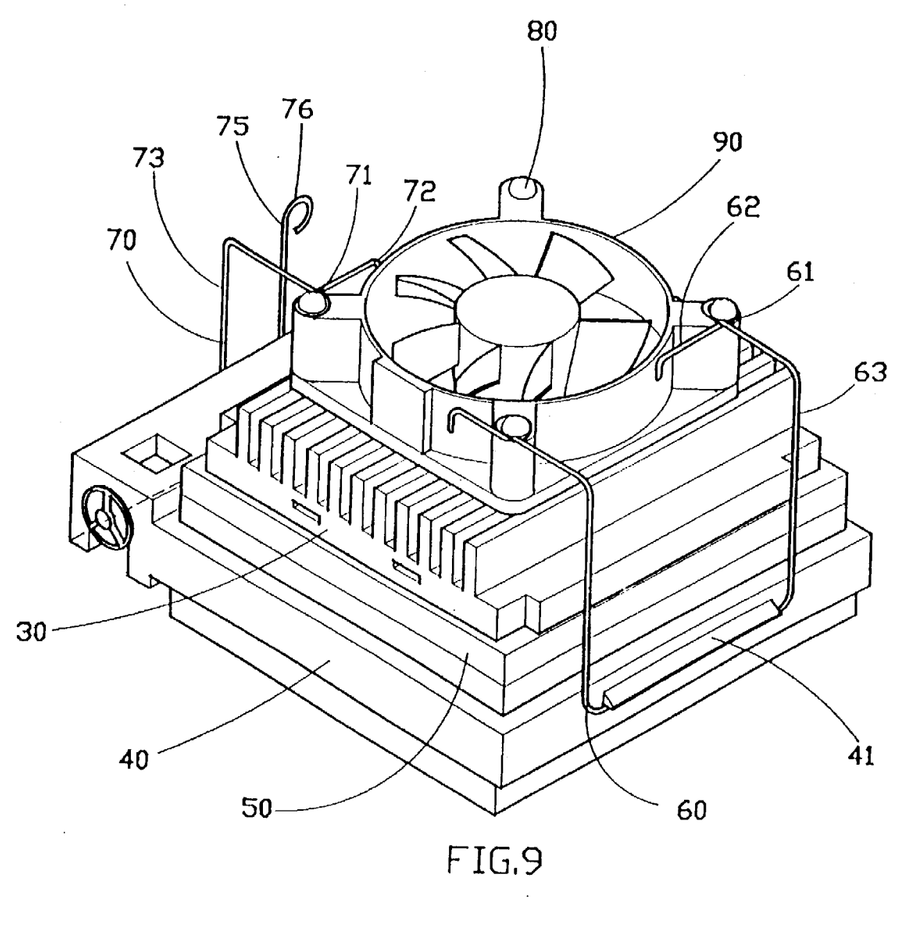
FIG. 9 is an elevational view of a CPU heat sink mounting structure according to a second embodiment of the present invention.
Figure 10:
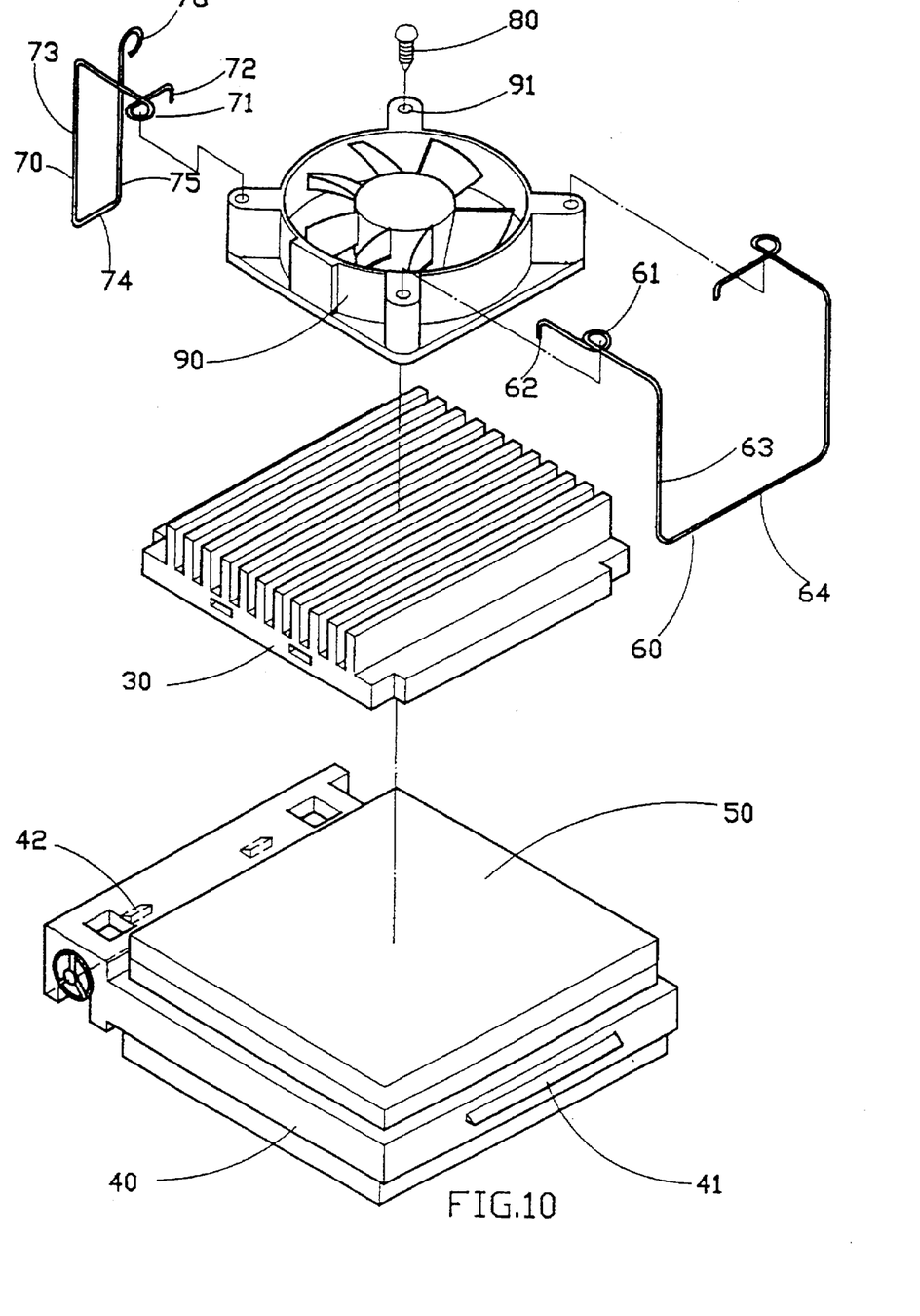
FIG. 10 is an exploded view of the second embodiment of the present invention.
Figure 11:
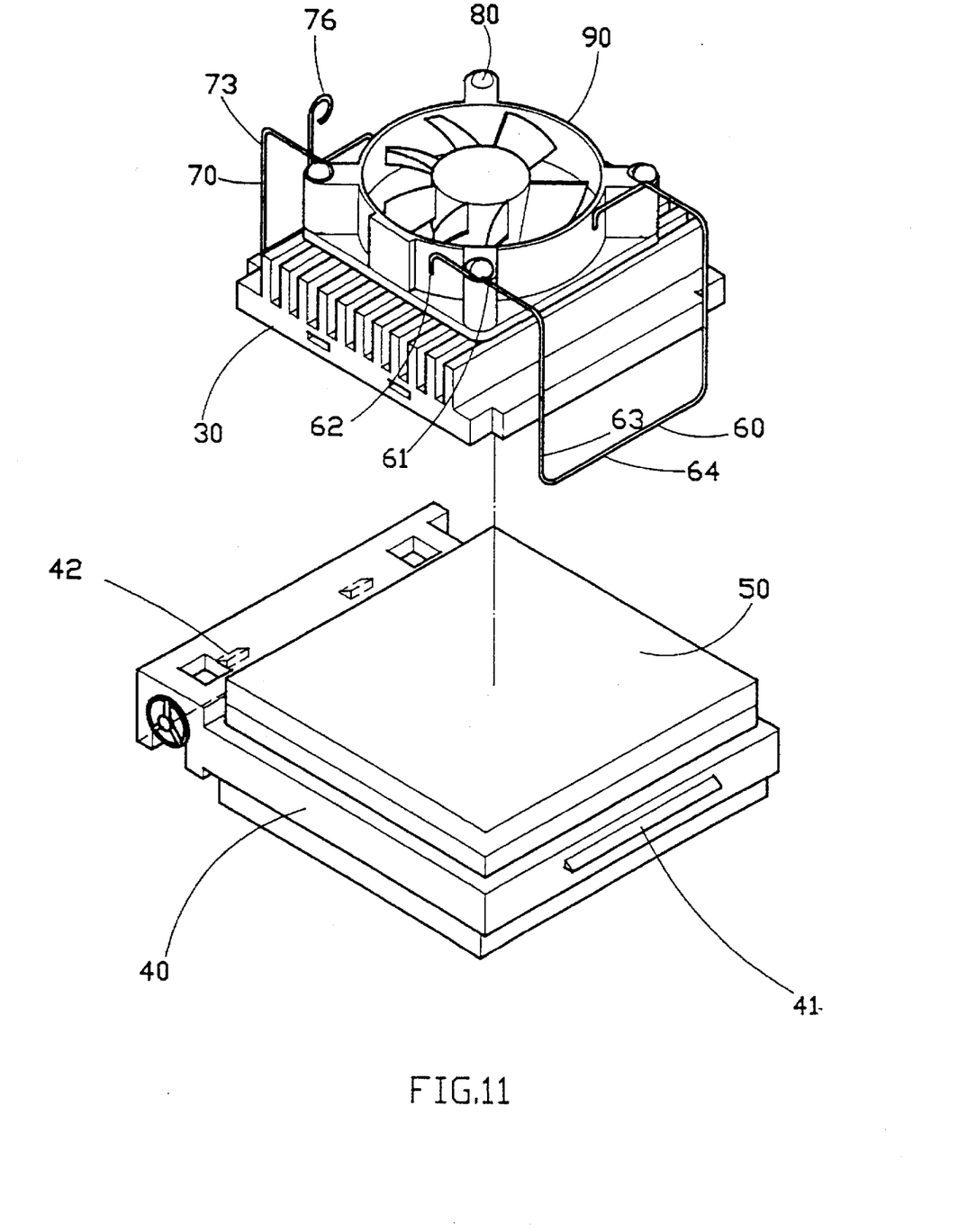
FIG. 11 is another exploded view of the second embodiment of the present invention, showing the clamping wires fastened to the fan and the heat sink.
Figure 12:
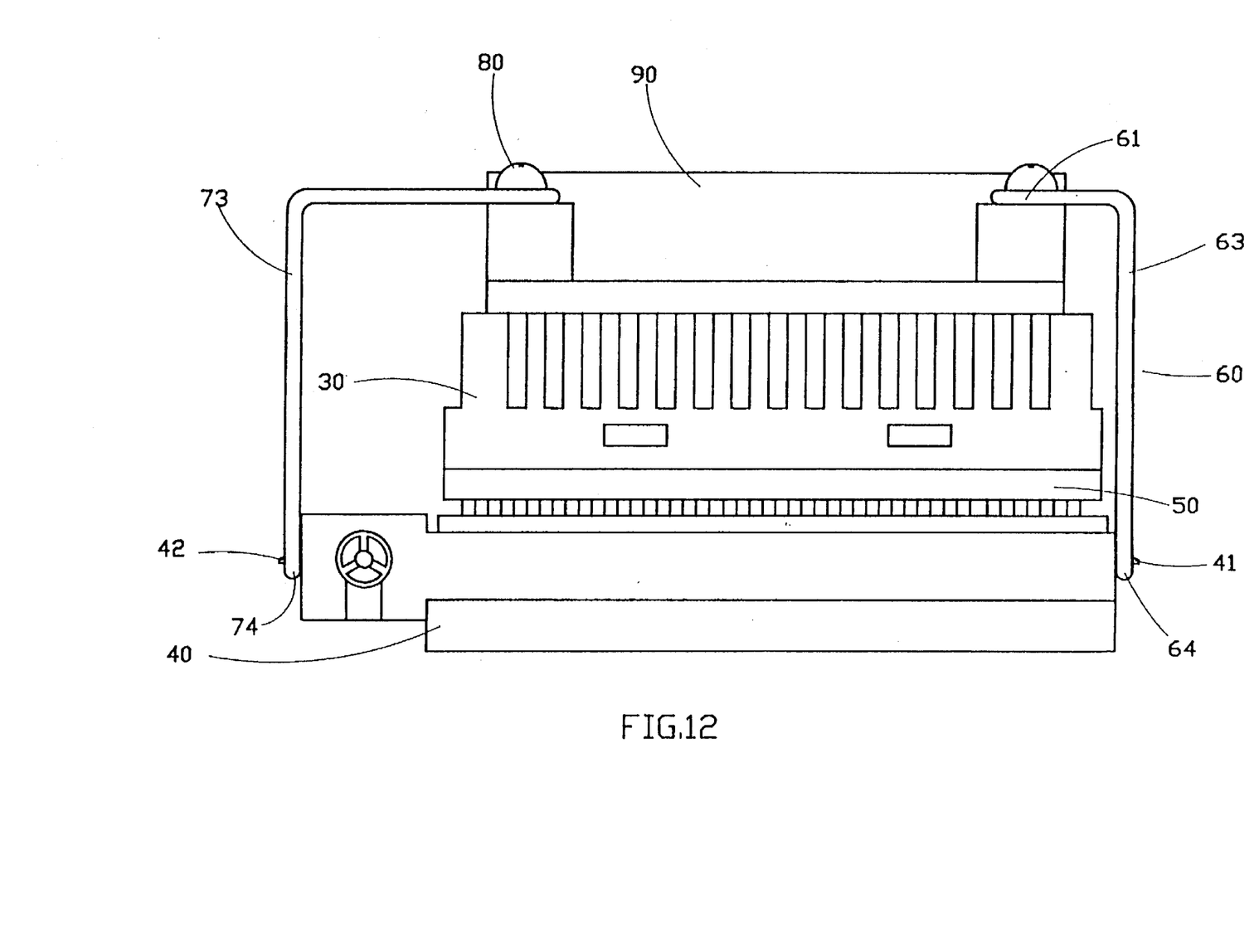
FIG. 12 is a side view in an enlarged scale of the second embodiment of the present invention.
Figure 13:
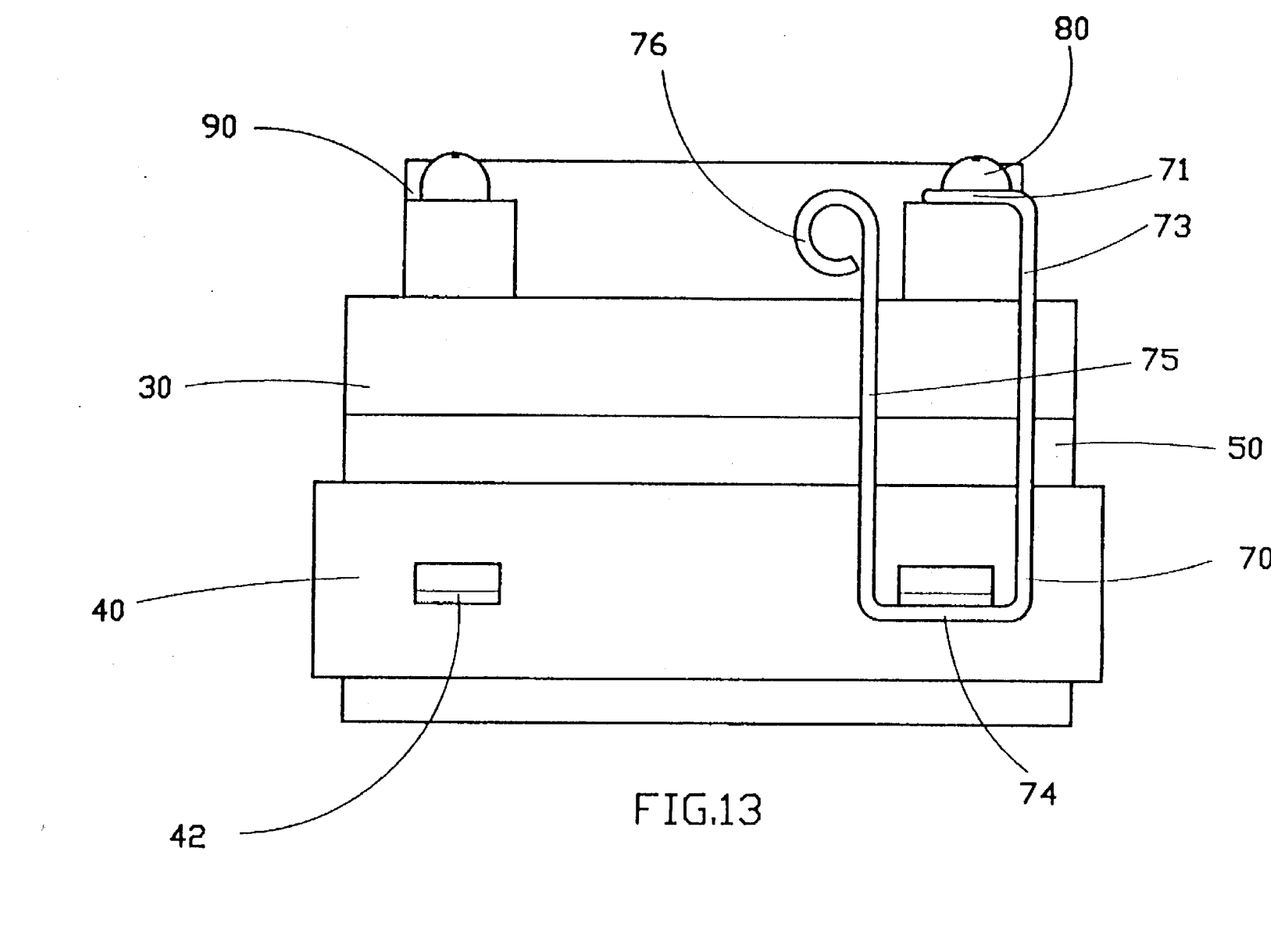
FIG. 13 is a front end view in an enlarged scale of the second embodiment of the present invention.
Figure 14:
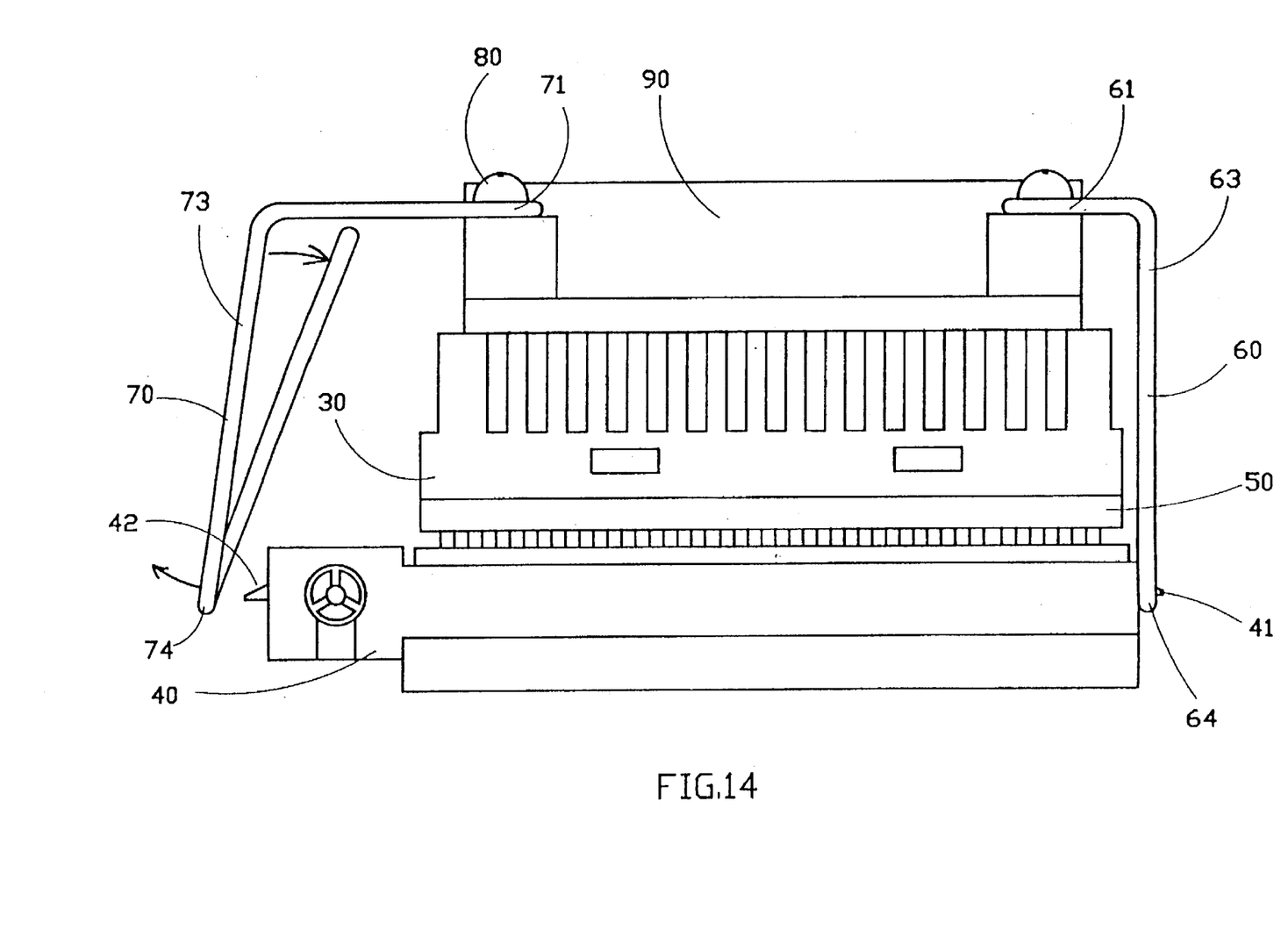
FIG. 14 is similar to FIG. 12 but showing the middle section of the front clamping wire disconnected from the retainer blocks of the CPU mount.

FIGS. 9 and 10 show an alternate form of the present invention, in which a heat sink 30 is mounted on a CPU 50 above a CPU mount 40 to carry a fan 90, a rear clamping wire 60 and a front clamping wire 70 are fastened to the heat sink 30, the fan 90, and the CPU mount 40 to secure them together. The rear clamping wire 60 comprises two hooked tips 62 at two opposite ends, a downward middle section 64, two L-shaped clamping arm sections 63 bilaterally connected between the hooked tips 62 and the downward middle section 64, and two looped portions 61 disposed between the hooked tips 62 and the L-shaped clamping arm sections 63. The front clamping wire 70 comprises a middle section 74, a hooked tip 72 at one end, a L-shaped clamping arm section 73, a looped portion 71 connected between the hooked tip 72 and the L-shaped clamping arm section 73, an actuating arm section 75 extending from one end of the middle section 74 remote from the L-shaped clamping arm section 73 and terminating in a loop-like handle portion 76.

Referring to FIGS. 11, 12, 13, and 14, during the installation of the embodiment of FIG. 10, the looped portions 61 of the rear clamping wire 60 and the looped portion 71 of the front clamping wire 70 are respectively fastened to respective mounting holes 91 of the fan 90 and respective mounting holes (not shown) of the heat sink 30 by respective screws 80, permitting the hooked tips 62 and 71 to be respectively stopped against the periphery of the fan 90, then the middle section 64 of the rear clamping wire 60 is hung on the rib 41 of the CPU mount 40, and then the handle portion 76 of the front clamping wire 70 is turned by hand to force the middle section 74 of the front clamping wire 70 into engagement with the retainer blocks 42 of the CPU mount 40.

It is to be understood that the drawings are designed for purposes of illustration only, and are not intended as a definition of the limits and scope of the invention disclosed.

I claim:

1. A CPU heat sink mounting structure comprising a CPU mount having a rib at a rear side thereof and two retainer blocks at a front side thereof, a CPU mounted on said CPU mount, a heat sink mounted on said CPU above said CPU mount, a fan fastened to said heat sink by screws, a front clamping wire and a rear clamping wire fixed to said fan by said screws and secured to said CPU mount to hold said fan, said heat sink, said CPU, and said CPU mount together, wherein said front clamping wire comprises a middle section forced into engagement with the retainer blocks of said CPU mount, a hooked tip at one end stopped against the periphery of said fan, a L-shaped clamping arm section clamped on the periphery of said CPU mount, a looped portion connected between the hooked tip and L-shaped clamping arm section of said front clamping wire and fixed to said fan by said screws, an actuating arm section extending from one end of the middle section of said front clamping wire remote from the L-shaped clamping arm section of said front clamping wire and terminating in a loop-like handle portion for turning by hand to disconnect the middle section of said front clamping wire from the retainer blocks of said CPU mount; said rear clamping wire comprises two hooked tips at two opposite ends stopped against the periphery of said fan, a downward middle section hung on the rib of said CPU mount, two L-shaped clamping arm sections bilaterally connected between the hooked tips and downward middle section of said rear clamping wire and clamped on the periphery of said heat sink and said CPU, and two looped portions disposed between the hooked tips and L-shaped clamping arm sections of said rear clamping wire and fixed to said fan by said screws.

2. A CPU heat sink mounting structure comprising a front clamping wire and a rear clamping wire securing a fan and a heat sink to a CPU mount to hold a CPU in between said heat sink and said CPU mount; said rear clamping wire comprising two downward tips at two opposite ends stopping at the periphery of the fan, a horizontal middle section hooking on a rear horizontal rib of the CPU mount; two vertical side sections respectively raised from two opposite ends of the horizontal middle section of said rear clamping wire bridging over the CPU and the heat sink at one side, two looped coupling sections respectively connected between downward tips and vertical side sections of said rear clamping wire fastened to respective mounting holes of the fan by a respective screw: said front clamping wire compressing a horizontal middle section hooking on front retainer blocks of the CPU mount, a downward tip at one end stopping at the periphery of the fan, a loop-like tip at an opposite end which can be moved by hand, a L-shaped connecting section connected between one end of the horizontal middle section of said front clamping wire and the downward tip of said front clamping wire bridging over the CPU and the heat sink at one side, a looped coupling section connected between the downward tip and L-shaped connecting section of said front clamping wire secured to one mounting hole of said fan by a screw, and an upright actuating section connected between an opposite end of the horizontal middle section of said front clamping wire and the loop-liked tip of said front clamping wire forcing the horizontal middle section of said front clamping wire away from the retainer blocks of the CPU mount when the loop-liked tip of said front clamping wire is pushed by hand.

* * * * *